US012130335B2

(12) United States Patent
Fan

(10) Patent No.: US 12,130,335 B2
(45) Date of Patent: Oct. 29, 2024

(54) METHODS AND DEVICES FOR DETERMINING BATTERY STATE OF HEALTH USING INCREMENTAL CAPACITY ANALYSIS AND SUPPORT VECTOR REGRESSION

(71) Applicant: Cummins Inc., Columbus, IN (US)

(72) Inventor: Guodong Fan, Bargersville, IN (US)

(73) Assignee: Cummins Inc., Columbus, IN (US)

( * ) Notice: Subject to any disclaimer, the term of this patent is extended or adjusted under 35 U.S.C. 154(b) by 499 days.

(21) Appl. No.: 17/613,631

(22) PCT Filed: Jun. 5, 2020

(86) PCT No.: PCT/US2020/036389
§ 371 (c)(1),
(2) Date: Nov. 23, 2021

(87) PCT Pub. No.: WO2020/251854
PCT Pub. Date: Dec. 17, 2020

(65) Prior Publication Data
US 2022/0229121 A1 Jul. 21, 2022

Related U.S. Application Data

(60) Provisional application No. 62/861,504, filed on Jun. 14, 2019.

(51) Int. Cl.
*H02J 7/00* (2006.01)
*B60L 3/12* (2006.01)
(Continued)

(52) U.S. Cl.
CPC .............. *G01R 31/392* (2019.01); *B60L 3/12* (2013.01); *B60L 58/16* (2019.02); *G01R 31/367* (2019.01); *B60L 2260/44* (2013.01)

(58) Field of Classification Search
CPC ....... G01R 31/392; G01R 31/367; B60L 3/12; B60L 58/16; B60L 2260/44
(Continued)

(56) References Cited

U.S. PATENT DOCUMENTS 8,855,954 B1 10/2014 Bickford
10,209,314 B2 2/2019 Garcia
(Continued)

OTHER PUBLICATIONS

International Preliminary Report on Patentability received for PCT Patent Application No. PCT/US2020/036389, mailed on Dec. 23, 2021, 8 pages.
(Continued)

*Primary Examiner* — Zixuan Zhou
(74) *Attorney, Agent, or Firm* — Faegre Drinker Biddle & Reath LLP

(57) ABSTRACT

A computer-implemented method for establishing a trained state of health (SOH) estimation model, the method comprising: acquiring a voltage vs. capacity (QV) data of a training battery at a first SOH within a predetermined voltage range during a charging cycle; obtaining an incremental capacity (IC) data based on at least the acquired QV data; extracting an ICA area and an ICA peak from the IC data; inputting the extracted ICA area and the ICA peak into an ICA database; repeating the acquiring, the obtaining, the extracting, and the inputting processes on the training battery at one or more additional SOHs; and establishing the trained SOH estimation model by training and testing a base SOH estimation model based on at least the ICA database using Support Vector Regression; wherein the trained SOH estimation model is configured to be used by a battery management system to monitor the health of a battery.

20 Claims, 11 Drawing Sheets

(51) Int. Cl.
 *B60L 58/16* (2019.01)
 *G01R 31/367* (2019.01)
 *G01R 31/392* (2019.01)

(58) Field of Classification Search
 USPC .................................. 320/132; 324/425–434
 See application file for complete search history.

(56) References Cited

U.S. PATENT DOCUMENTS

| | | |
|---|---|---|
| 2003/0074335 A1 | 4/2003 | Singh |
| 2011/0231054 A1 | 9/2011 | Zhang |
| 2015/0066406 A1 | 3/2015 | Sun et al. |
| 2016/0363632 A1 | 12/2016 | Park et al. |
| 2017/0345478 A1 | 11/2017 | Zhou et al. |
| 2018/0306868 A1 | 10/2018 | Kim |
| 2022/0236335 A1* | 7/2022 | Wang .................. G01R 31/392 |

OTHER PUBLICATIONS

International Search Report and Written Opinion for International patent application No. PCT/US2020/036389, filed Jun. 5, 2020, mailed Aug. 18, 2020.

Wang et al. "Remaining capacity estimation of lithium-ion batteries based on the constant woltage charging profile." In: PloS one. Jul. 6, 2018 (Jul. 6, 2018). Retrieved on Aug. 1, 2020 (Aug. 1, 2020) from <https://www.ncbi.nlm.nih.gov/pmc/articles/PMC6034863/pdf/pone.0200169.pdf> entire document.

* cited by examiner

METHODS AND DEVICES FOR DETERMINING BATTERY STATE OF HEALTH USING INCREMENTAL CAPACITY ANALYSIS AND SUPPORT VECTOR REGRESSION

CROSS-REFERENCE TO RELATED APPLICATIONS

This application is a national phase application of International Application No. PCT/US2020/036389, filed on Jun. 5, 2020, which claims priority to U.S. Provisional Application No. 62/861,504, filed on Jun. 14, 2019, each incorporated herein by reference in its entirety.

FIELD OF THE DISCLOSURE

Certain embodiments of the present disclosure are directed to battery analysis. More particularly, some embodiments of the disclosure provide systems and methods for determining battery state of health using Incremental Capacity Analysis and Support Vector Regression.

BACKGROUND OF THE DISCLOSURE

Certain embodiments of the present disclosure are directed to battery analysis. More particularly, some embodiments of the disclosure provide systems and methods for determining battery state of health using Incremental Capacity Analysis and Support Vector Regression. Merely by way of example, some embodiments of the disclosure have been applied to diagnosing a battery. But it would be recognized that the disclosure has a much broader range of applicability, such as for other types of energy storage devices.

In various use cases, such as in mobile storage (e.g., electric vehicles), stationary storage (e.g., grid storage) and portable storage (e.g., personal electronics) applications, a state of health (SOH) of an energy storage device is an indication of the health condition of the energy storage device. For many battery management systems (BMS), SOH is key information. In some scenarios, SOH corresponds to the decrease of total capacity and/or rise of internal resistance, compared to a fresh cell. As an example, a fresh cell (e.g., off-the-manufacturing-line or off-the-shelf) often has an initial SOH of 100% or near 100% (e.g., above 90%, 95%, or 99%), whereas an aged cell (e.g., having been discharged and charged at least by one cycle) has an aged SOH less than the initial SOH. Monitoring SOH is applicable for a variety of energy storage devices, including but not limited to a lithium-ion battery, a sodium-ion battery, a supercapacitor, a fuel cell, a flow battery, a metal-air battery, a molten salt battery, a nickel metal hydride battery, a sodium-sulfur battery, and a lead-acid battery. In some use cases, adapting a system and/or a method (e.g., a SOH estimation algorithm) for predicting SOH quickly, accurately, robustly, and/or in real-time, is very desirable for battery health diagnostics and prognostics.

BRIEF SUMMARY OF THE DISCLOSURE

Certain embodiments of the present disclosure are directed to battery analysis. More particularly, some embodiments of the disclosure provide systems and methods for determining battery state of health using Incremental Capacity Analysis and Support Vector Regression. Merely by way of example, some embodiments of the disclosure have been applied to diagnosing a battery. But it would be recognized that the disclosure has a much broader range of applicability, such as for other types of energy storage devices.

In various embodiments, a computer-implemented method for establishing a trained state of health (SOH) estimation model comprises: acquiring a voltage vs. capacity (QV) data of a training battery at a first SOH within a predetermined voltage range during a charging cycle; obtaining an incremental capacity (IC) data based on at least the acquired QV data; extracting an ICA area and an ICA peak from the IC data; inputting the extracted ICA area and the ICA peak into an ICA database; repeating the acquiring, the obtaining, the extracting, and the inputting processes on the training battery at one or more additional SOHs; and establishing the trained SOH estimation model by training and testing a base SOH estimation model based on at least the ICA database using Support Vector Regression.

In some embodiments, the computer-implemented method further includes pre-processing the IC data after the process of obtaining the IC data and before the process of extracting the ICA area and the ICA peak from the IC data.

In some embodiments, pre-processing the IC data includes smoothening the IC data.

In some embodiments, the obtaining the IC data based on at least the acquired QV data includes differentiating the acquired capacity over the acquired voltage.

In some embodiments, the extracting an ICA area and an ICA peak from the IC data includes: extracting multiple ICA secondary areas and multiple secondary ICA secondary peaks from the IC data, wherein each of the multiple ICA secondary areas corresponds to one of the multiple secondary ICA secondary peaks.

In some embodiments, the training battery is of a first battery type. In some examples, the trained SOH estimation model is established to predict a predicted SOH of a battery of the first battery type.

In some embodiments, the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

In some embodiments, the method further includes repeating the acquiring, the obtaining, the extracting, and the inputting processes on the on one or more additional training batteries at multiple SOHs.

In various embodiments, a system for establishing a trained SOH estimation model comprises: a QV data acquiring module configured to obtain a QV data of a training battery at a first SOH within a predetermined voltage range during a charging cycle; an IC data obtaining module configured to obtain an IC data based on at least the acquired QV data; an extracting module configured to extract an ICA area and an ICA peak from the IC data; an inputting module configured to input the extracted ICA area and the ICA peak into an ICA database; and an establishing module configured to establish the trained SOH estimation model by training and testing a base SOH estimation model based on at least the ICA database using Support Vector Regression.

In some embodiments, the system further includes a pre-processing module configured to pre-process the IC data.

In some embodiments, the pre-processing module is configured to smoothen the IC data.

In some embodiments, the extracting module is further configured to extract multiple ICA secondary areas and multiple secondary ICA secondary peaks from the IC data, wherein each of the multiple ICA secondary areas corresponds to one of the multiple secondary ICA secondary peaks.

In some embodiments, the training battery is of a first battery type, and wherein the establishing module is configured to establish the trained SOH estimation model to predict a predicted SOH of a battery of the first battery type.

In some embodiments, the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

In various embodiments, a non-transitory computer-readable medium with instructions stored thereon, that when executed by a processor, cause the processor to perform processes including: acquiring a QV data of a training battery at a first SOH within a predetermined voltage range during a charging cycle; obtaining an IC data based on at least the acquired QV data; extracting an ICA area and an ICA peak from the IC data; inputting the extracted ICA area and the ICA peak into an ICA database; repeating the acquiring, the obtaining, the extracting, and the inputting processes on the training battery at one or more additional SOHs; and establishing the trained SOH estimation model by training and testing a base SOH estimation model based on at least the ICA database using Support Vector Regression.

In some embodiments, the non-transitory computer-readable medium, when executed by the processor, further performs the process of pre-processing the IC data after the process of obtaining the IC data and before the process of extracting the ICA area and the ICA peak from the IC data.

In some embodiments, pre-processing the IC data includes smoothening the IC data.

In some embodiments, obtaining the incremental capacity (IC) data based on at least the acquired QV data includes differentiating the acquired capacity over the acquired voltage.

In some embodiments, the non-transitory computer-readable medium, when executed by the processor, further performs the process of extracting multiple ICA secondary areas and multiple secondary ICA secondary peaks from the IC data, wherein each of the multiple ICA secondary areas corresponds to one of the multiple secondary ICA secondary peaks.

In some embodiments, the training battery is of a first battery type, and wherein the non-transitory computer-readable medium when executed by the processor, performs the process of establishing the trained SOH estimation model including establishing the trained SOH estimation model to predict a predicted SOH of a battery of the first battery type.

In some embodiments, the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

In various embodiments, a computer-implemented method for predicting a predicted state of health (P-SOH) of a battery comprises: establishing a trained SOH estimation model; acquiring a QV data of the battery at a to-be-determined SOH (TBD-SOH) within a predetermined voltage range during a charging cycle; obtaining an IC data based on at least the acquired QV data; pre-processing the IC data; extracting an ICA area and an ICA peak from the IC data; and predicting the P-SOH corresponding to the TBD-SOH based on at least analyzing the extracted ICA area and ICA peak using the trained state of health estimation model.

In various embodiments, a system for predicting a predicted state of health (P-SOH) of a battery comprises: a model establishing module configured to establish a trained SOH estimation model; a QV data acquiring module configured to obtain a QV data of the battery at a to-be-determined SOH (TBD-SOH) within a predetermined voltage range during a charging cycle; an IC data obtaining module configured to obtain an IC data based on at least the acquired QV data; a pre-processing module configured to pre-process the IC data; an extracting module configured to extract an ICA area and an ICA peak from the IC data; and a predicting module configured to predict the P-SOH corresponding to the TBD-SOH based on at least analyzing the extracted ICA area and ICA peak using the trained state of health estimation model.

In various embodiments, a non-transitory computer-readable medium with instructions stored thereon, that when executed by a processor, cause the processor to perform processes including: establishing a trained SOH estimation model; acquiring a QV data of the battery at a to-be-determined SOH (TBD-SOH) within a predetermined voltage range during a charging cycle; obtaining an IC data based on at least the acquired QV data; pre-processing the IC data; extracting an ICA area and an ICA peak from the IC data; and predicting the P-SOH corresponding to the TBD-SOH based on at least analyzing the extracted ICA area and ICA peak using the trained state of health estimation model.

DETAILED DESCRIPTION OF THE DISCLOSURE

Figure 1:
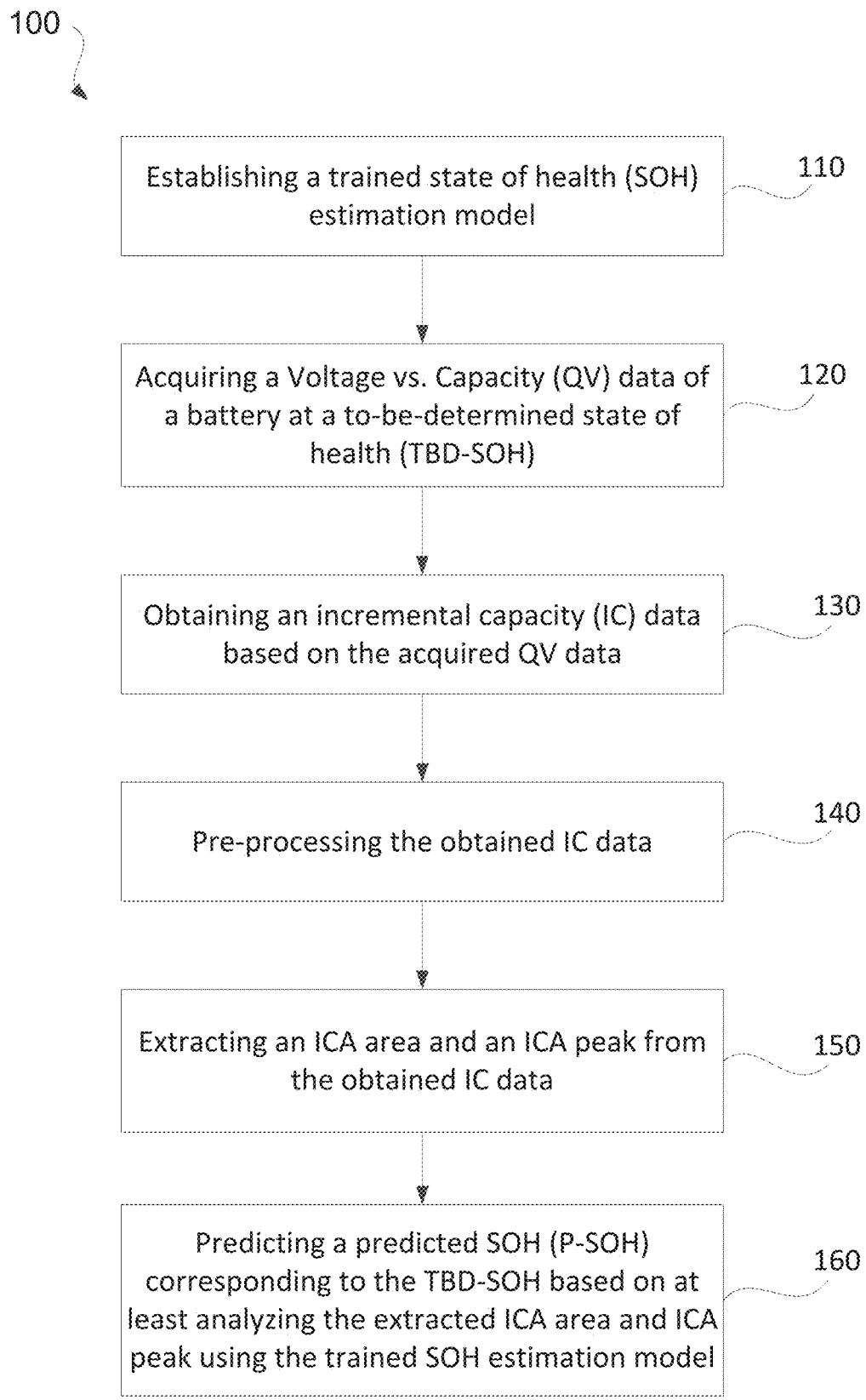
FIG. 1 is a simplified diagram showing a method for predicting a predicted state of health of a battery, according to some embodiments of the present disclosure.

Certain embodiments of the present disclosure are directed to battery analysis. More particularly, some embodiments of the disclosure provide systems and methods for determining battery state of health using Incremental Capacity Analysis and Support Vector Regression. Merely by way of example, some embodiments of the disclosure have been applied to diagnosing a battery (e.g., a rechargeable battery). But it would be recognized that the disclosure has a much broader range of applicability, such as for other types of energy storage devices.

In various examples, Incremental Capacity Analysis (ICA) is used to investigate the change of the battery state (e.g., a battery's SOH) by tracking one or more electrochemical properties of the cell. For example, the one or more electrochemical properties includes capacity and/or internal resistance. In various embodiments, ICA provides insights on battery degradation in a quantifiable manner. In certain examples, ICA includes acquiring (e.g., measuring) a voltage vs. capacity (QV) data of a battery, for example, during a charging cycle, then calculating the differentiation of the battery capacity (Q) over the battery voltage (V) at a predetermined condition (e.g., voltage range). In some examples, ICA includes examining the evolution of the differentiation result, which may be presented as an IC curve (e.g., a dQ/dV vs. V curve), as battery ages (e.g., increase in charged cycles) and to monitor a correlation between the battery's SOH and an ICA area (A) and an ICA peak (P). In various examples, the ICA area represents the area value under the IC curve (e.g., integration of the IC curve), whereas the ICA peak represents the capacity value of a peak (e.g., the highest peak) of the IC curve.

In some examples, the ICA area and/or the ICA peak are determined (e.g., extracted) from the IC curve under a predetermined condition, such as a predetermined voltage range. In other words, the ICA area and/or the ICA peak are determinable from a partial ICA curve and not requiring the full ICA curve, in accordance with various embodiments. In certain examples, the predetermined voltage range is smaller than the charging voltage range, for example, the predetermined voltage range is less than 90%, 80%, 70%, 60%, 50%, 40%, 30%, 20%, or 10% of the charging voltage range. As an example, for a charging voltage range of 2V to 4V, a predetermined voltage range can be from 2.5V to 3.5V. In some embodiments, an ICA curve obtained for a charging cycle that is partial (e.g., not charged to 100% state of charge) instead of full (e.g., charged to 100% state of charge) is sufficient for extracting an ICA area and/or an ICA peak, thus enabling estimation of SOH of a battery without the need to fully charge the battery.

In various examples, Support Vector Regression (SVR) is used in the establishing of a trained SOH estimation model. In certain examples, SVR is used as a machine learning method for analyzing data used for linear and/or nonlinear regression analysis of the ICA characteristics (e.g., the ICA area and/or the ICA peak). In some examples, a SVR model is developed to identify the nonlinear correlations between the battery SOH and the ICA characteristics. In certain embodiments, the use of ICA and SVR reduces SOH estimation error, such as error induced by battery cell variations and measurement noise, thus improving the robustness of the system and/or method for predicting SOH of a battery. In some embodiments, the use of ICA and SVR increases the speed of battery SOH estimation, for example, by eliminating the need to charge or discharge the battery substantially to obtain sufficient data for battery SOH estimation.

FIG. 1 is a simplified diagram showing a method 100 for predicting a predicted state of health of a battery (e.g., a rechargeable battery), according to some embodiments of the present disclosure. This diagram is merely an example, which should not unduly limit the scope of the claims. One of ordinary skill in the art would recognize many variations, alternatives, and modifications. In some examples, the method 100 includes a process 110 of establishing a trained state of health (SOH) estimation model, a process 120 of acquiring a Voltage vs. Capacity (QV) data of a battery at a to-be-determined state of health (TBD-SOH), a process 130 of obtaining an incremental capacity (IC) data based on the acquired QV data, a process 140 of pre-processing the obtained IC data, a process 150 of extracting an ICA area and an ICA peak from the obtained IC data, and a process 160 of predicting a predicted SOH (P-SOH) corresponding to the TBD-SOH based on at least analyzing the extracted ICA area and ICA peak using the trained SOH estimation model. Although the above has been shown using a selected group of processes for the method, there can be many alternatives, modifications, and variations. For example, one or more processes may be expanded and/or combined. One or more processes may be inserted to those noted above. One or more processes may be removed. Depending upon the embodiment, the sequence of the processes may be interchanged with others replaced.

Figure 2:
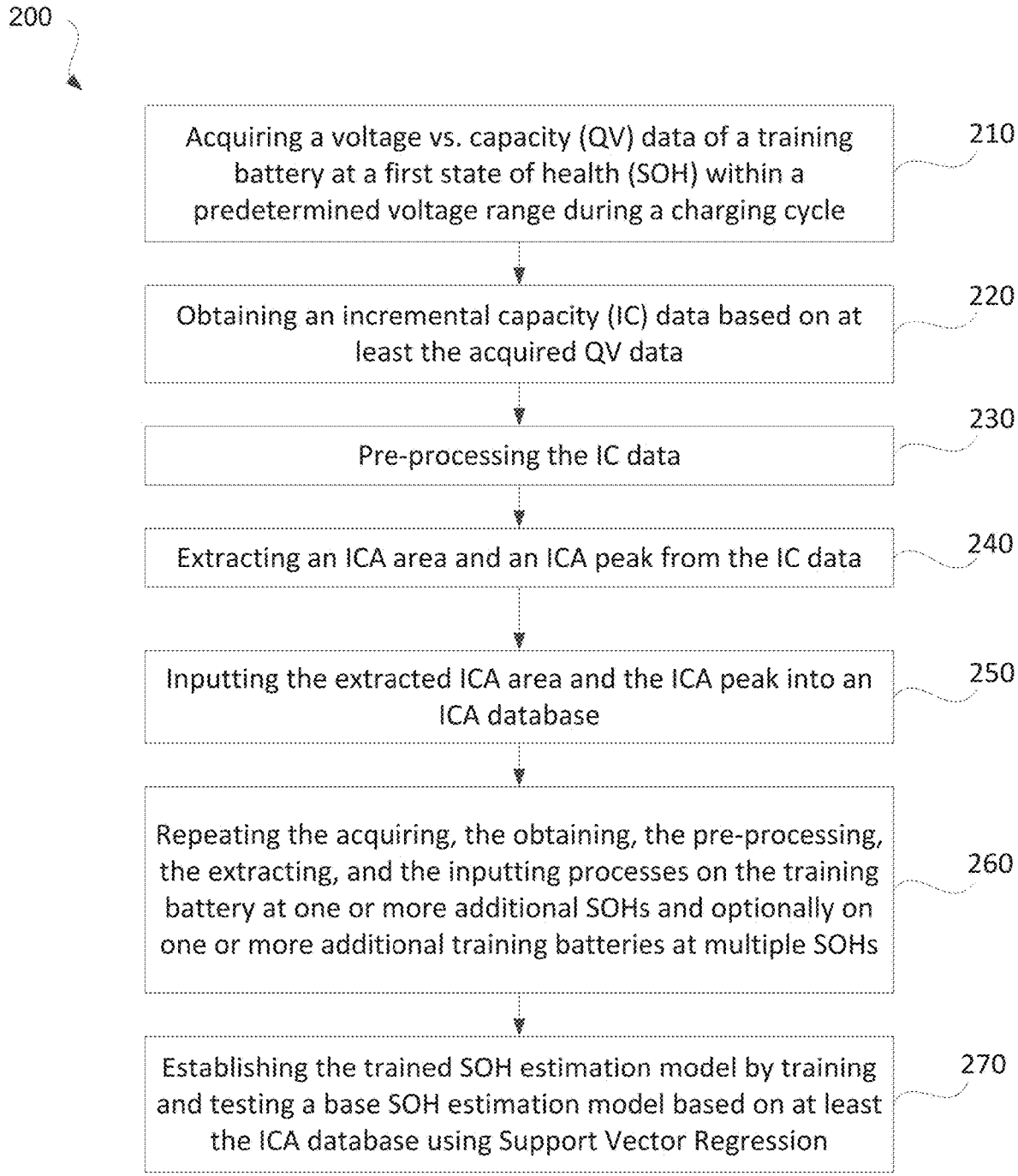
FIG. 2 is a simplified diagram showing a method for establishing a trained state of health (SOH) estimation model, according to some embodiments of the present disclosure.

In various embodiments, the process 110 of establishing a trained SOH estimation model is depicted in FIG. 2. FIG. 2 is a simplified diagram showing a method 200 for establishing a trained SOH estimation model, according to some embodiments of the present disclosure. This diagram is merely an example, which should not unduly limit the scope of the claims. One of ordinary skill in the art would recognize many variations, alternatives, and modifications. In some examples, the method 200 includes a process 210 of acquiring a QV data of a training battery at a first SOH within a predetermined voltage range during a charging cycle, a process 220 of obtaining an IC data based on at least the acquired QV data, a process 230 of pre-processing the IC data, a process 240 of extracting an ICA area and an ICA peak from the IC data, a process 250 of inputting the extracted ICA area and the ICA peak into an ICA database, a process 260 of repeating the acquiring, the obtaining, the pre-processing, the extracting, and the inputting processes on the training battery at one or more additional SOHs and optionally on one or more additional training batteries at multiple SOHs, and a process 270 of establishing the trained SOH estimation model by training and testing a base SOH estimation model based on at least the ICA database using Support Vector Regression. Although the above has been shown using a selected group of processes for the method, there can be many alternatives, modifications, and variations. For example, one or more processes may be expanded and/or combined. One or more processes may be inserted to those noted above. One or more processes may be removed. Depending upon the embodiment, the sequence of the processes may be interchanged with others replaced. In certain alternative embodiments, the process 110 of establishing a trained SOH estimation model includes receiving the trained SOH estimation model from a model source (e.g., a server, an external storage drive).

Figure 3:
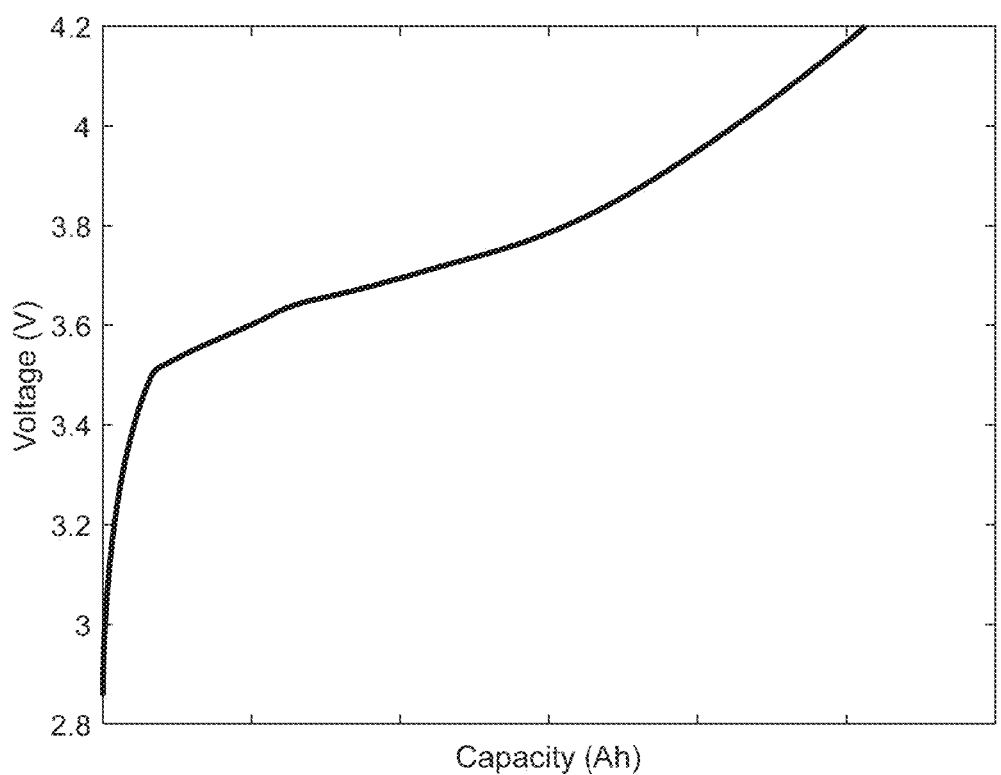
FIG. 3 is a representative diagram showing a voltage vs. capacity (QV) data acquired during a charging cycle of a battery.

In various embodiments, the process 210 of acquiring a QV data of a training battery (e.g., for purpose of establishing the trained SOH estimation model) at a first SOH within a predetermined voltage range during a charging cycle includes measuring the QV data including battery voltage data and corresponding battery capacity data of the training battery within a target voltage range during a charging cycle. As an example, FIG. 3 shows a QV curve (e.g., V data plotted on a V vs. Q graph) of a QV data acquired during a charging cycle of a battery within a charging voltage range of about 2.9V to 4.2V. In certain examples, the charging cycle is a constant current charging cycle. In certain alternative embodiments, the process 210 includes acquiring the QV data of the training battery during a discharging cycle (e.g., a constant current discharging cycle). In some examples, the first SOH is a known SOH or a reference SOH.

Figure 4:
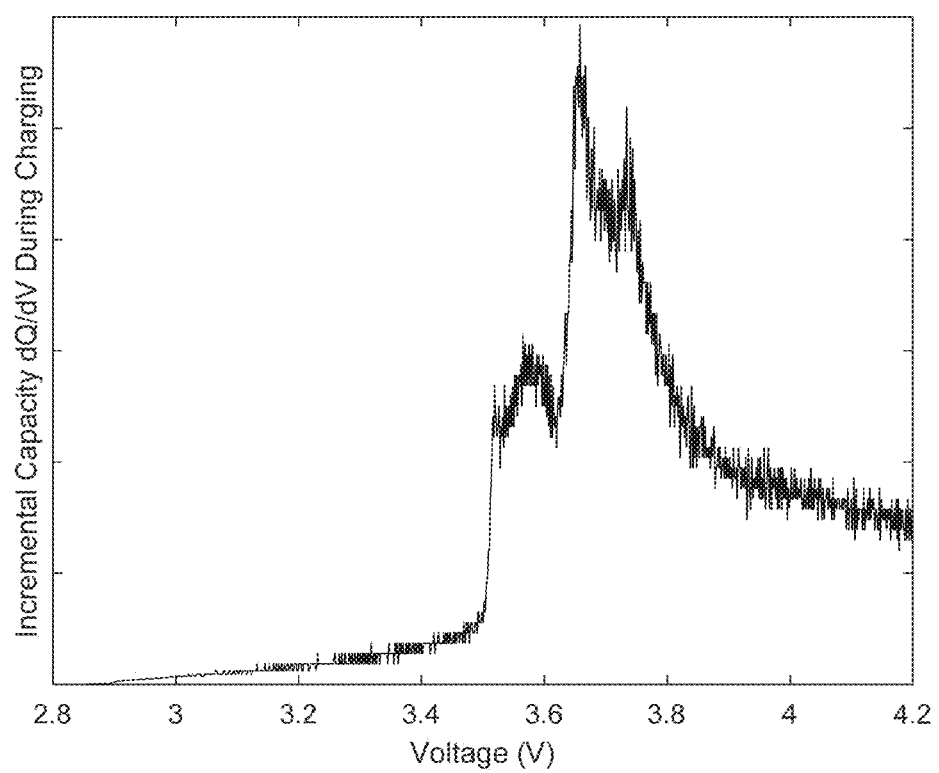
FIG. 4 is a representative diagram showing an incremental capacity (IC) data obtained based on at least the QV data of FIG. 3.

In various embodiments, the process 220 of obtaining an IC data based on at least the acquired QV data includes differentiating the acquired battery capacity over the battery voltage, such as taking a first derivative of a QV curve of a QV data:

$$\frac{dQ}{dV} = \frac{\Delta Q}{\Delta V} = \frac{Q_k - Q_{k-1}}{V_k - V_{k-1}}$$

where k is selected from a range of 1 to K, where K is the total number of QV data-pairs. As an example, FIG. 4 shows an IC curve (e.g., IV data plotted on a dQ/dV vs. V graph) of an IC data acquired based on at least the QV data of FIG. 3.

In various embodiments, the process 230 of pre-processing the IC data includes smoothening the IC data. In some examples, smoothening the IC data is performed using a gaussian smoothening algorithm. In certain examples, smoothening the IC data includes reducing noise, removing outliers, and/or altering the curve based on a pre-processing model (e.g., an artificial intelligence model). As an example, FIG. 5 shows a pre-processed IC curve of the IC curve of FIG. 4.

In some embodiments, obtaining an IC curve (e.g., pre-processed IC curve) of a battery includes obtaining one or more peaks each corresponding to one of one or more peak values of the corresponding IC data. A peak value of a IC data may be referred to as an ICA peak. As an example, the smoothened IC curve of FIG. 5 shows three peaks each corresponding to an electrochemical process. FIG. 6 is a representative diagram showing an insertion map of a NMC-Graphite Li-ion battery. NMC stands for Lithium Nickel Manganese Cobalt Oxide, which is a cathode material in this electrochemical couple. As shown, for a NMC-Graphite Li-ion battery, three electrochemical processes can be mapped onto an IC curve (e.g., see FIG. 5) of the NMC-Graphite Li-ion battery. Specifically, the highest peak in FIG. 5 corresponds to the 2*2 electrochemical process in FIG. 6, the second highest peak in FIG. 5 corresponds to the 1*1 electrochemical process in FIG. 6, and the third highest peak in FIG. 5 corresponds to the 2*5 electrochemical process in FIG. 6. In certain embodiments, as a battery ages, one or more peaks of an IC curve reduce in magnitude and can disappear, indicating that its corresponding electrochemical process is substantially inhibited, leading to loss in recoupable battery capacity. In some examples, monitoring the loss or reduction of an electrochemical process provides a quantifiable insight on battery degradation. In certain examples, a loss or reduction of an electrochemical process indicates a loss of Li-ion inventory (e.g., transportable between the cathode and anode), such as in a Li-ion battery.

Figure 5:
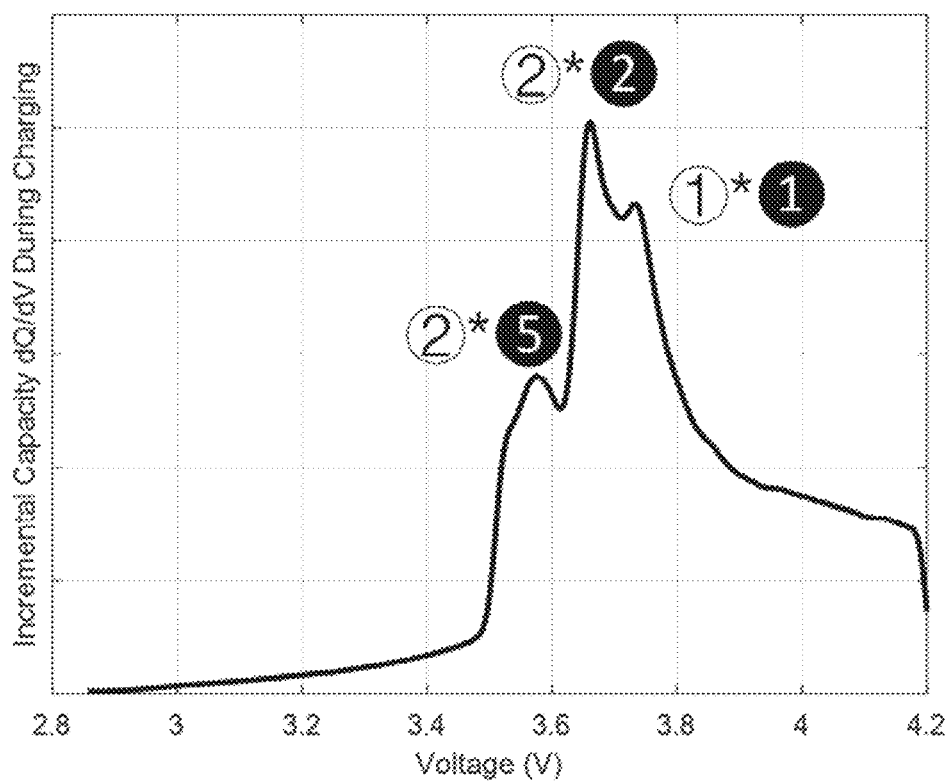
FIG. 5 is a representative diagram showing a smoothened IC data obtained based on at least smoothening the IC data of FIG. 4.
Figure 6:
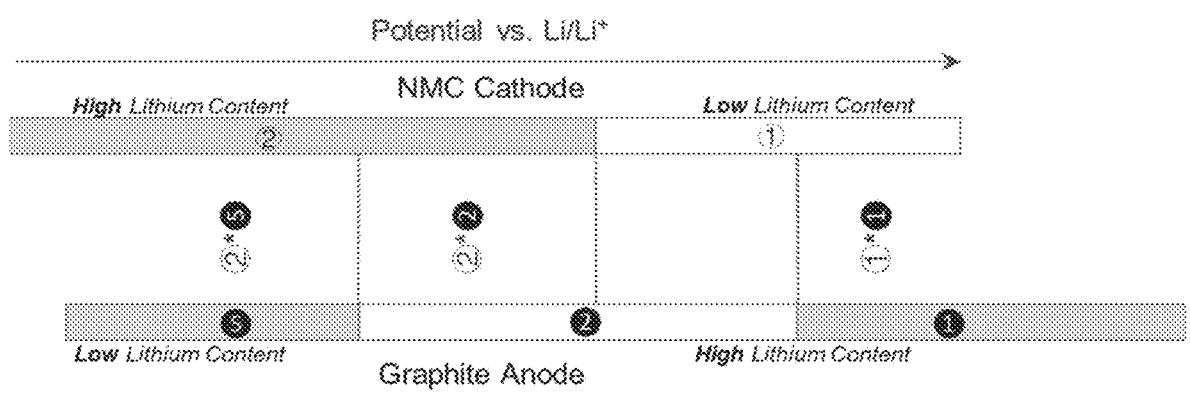
FIG. 6 is a representative diagram showing an insertion map of a NMC-Graphite Li-ion battery.

In various embodiments, the method 200 includes monitoring the one or more peaks, such as their reduction in magnitude along the incremental capacity axis (e.g., y-axis of FIG. 5) or shift in position along the voltage axis (e.g., x-axis of FIG. 5). In certain embodiments, reduction in magnitude along the incremental capacity axis indicates a loss in rechargeable battery capacity, which is indicative of battery aging; whereas shift in position along the voltage axis, such as towards higher voltage (e.g., increase in overpotential) indicates increase in battery internal resistance, which is also indicative of battery aging.

Figure 7:
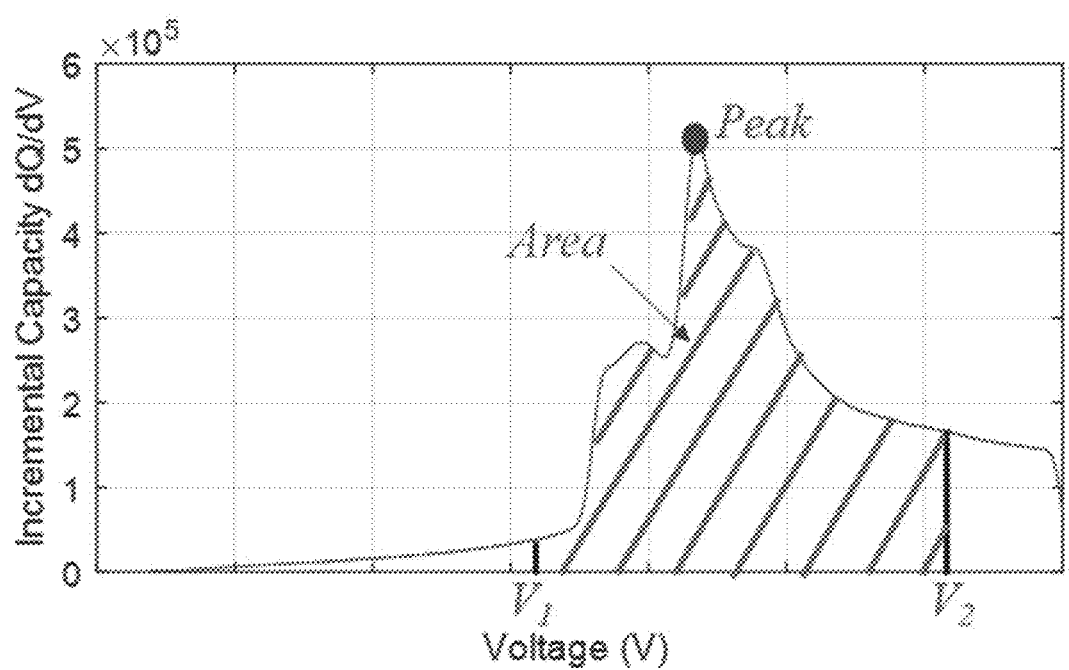
FIG. 7 is a representative diagram showing an ICA area and an ICA peak of the smoothened IC data of FIG. 5.

In various embodiments, the process 240 of extracting an ICA area and an ICA peak from the IC data includes extracting a peak value of the IC curve (e.g., the smoothened IC curve) to be the ICA peak and extracting an area value of the IC curve to be the ICA area. FIG. 7 is a representative diagram showing an ICA area and an ICA peak of the smoothened IC data of FIG. 5. In some examples, the ICA peak corresponds to the highest peak of the IC curve. In certain examples, the ICA peak corresponds to a peak of the IC curve within a predetermined voltage range, such as within a first voltage value ($V_1$) and a second voltage value ($V_2$). In certain examples, the ICA area is the area under the IC curve within the predetermined voltage range, such as within $V_1$ and $V_2$. In various examples, multiple ICA peaks and multiple ICA areas are extracted from an ICA curve.

In various embodiments, the process 250 of inputting the extracted ICA area and the ICA peak into an ICA database includes inputting the extracted ICA area and the ICA peak with respect to a SOH value corresponding to the battery health of the battery when the QV data is acquired, from which the ICA area and the ICA peak are extracted. In some examples, an ICA area is paired with an ICA peak, wherein the pair corresponds to one SOH of a battery.

Figure 8:
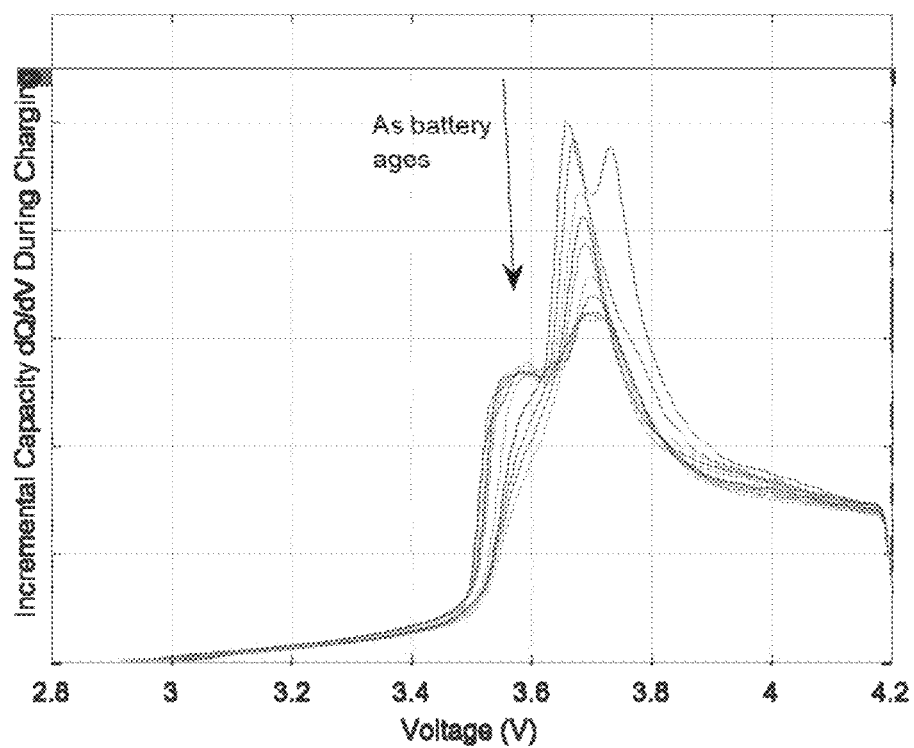
FIG. 8 is a representative diagram showing multiple IC data obtained based on at least multiple QV data acquired at multiple SOHs.

In various embodiments, the process 260 includes repeating a process of acquiring of another QV data at another SOH of the training battery within a predetermined voltage range during a charging cycle, a process of obtaining another IC data based on at least the another QV data, a process of pre-processing the another IC data, a process of extracting another ICA area and another ICA peak from the another IC data (e.g., smoothened), and a process of inputting the another ICA area and the another ICA peak into the ICA database. In some embodiments, performing the process 260 on the training battery includes acquiring multiple QV data at multiple SOHs of a training battery, obtaining multiple corresponding IC data, extracting multiple corresponding ICA areas and ICA peaks, and inputting the multiple corresponding ICA area and ICA peak into the database. As an example, FIG. 8 is a representative diagram showing multiple IC data obtained based on at least multiple QV data acquired at multiple SOHs of the same trained battery. As shown, as the battery ages, the magnitude of the ICA peak (e.g., the highest peak) reduces while overpotential increases, as indicated by the shift in peak position along the voltage axis towards the right. Notably, the second highest peak quickly disappears as the battery ages, indicating a loss in an electrochemical process, which further indicates a degraded battery. It is to be understood that FIGS. 3-8 are merely examples, which should not unduly limit the scope of the claims. One of ordinary skill in the art would recognize many variations (e.g., for other energy storage devices) without departing from the disclosed disclosure.

Figure 9:
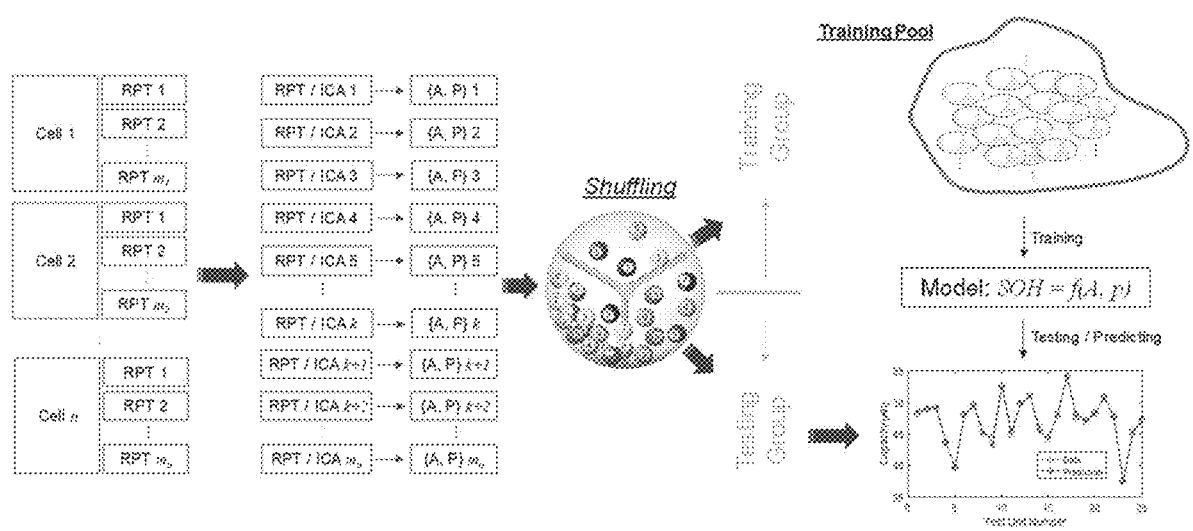
FIG. 9 is an illustrative diagram showing a method for establishing a trained SOH estimation model, according to some embodiments of the present disclosure.

In some embodiments, the process 260 optionally includes repeating a process of acquiring of another QV data at another SOH of one or more additional training batteries within a predetermined voltage range during a charging cycle, a process of obtaining another IC data based on at least the another QV data, a process of pre-processing the another IC data, a process of extracting another ICA area and another ICA peak from the another IC data (e.g., smoothened), and a process of inputting the another ICA area and the another ICA peak into the ICA database. In some embodiments, performing the process 260 on the one or more additional training battery includes acquiring multiple QV data at multiple SOHs of the one or more additional training batteries, obtaining multiple corresponding IC data, extracting multiple corresponding ICA areas and ICA peaks, and inputting the multiple corresponding ICA area and ICA peak into the database. FIG. 9 is an illustrative diagram showing a method for establishing a trained SOH estimation model, according to some embodiments of the present disclosure. In some examples, obtaining QV data of the one or more additional training batteries includes obtaining QV data at multiple testing conditions, where each of the one or more additional training batteries is tested at a different testing condition and/or each of the one or more additional training batteries is tested (e.g., sequentially) at more than one testing condition. In certain examples, the multiple testing conditions includes multiple testing temperatures (e.g., of the battery and/or of the testing environment), multiple input currents, multiple depth of discharges, multiple humidity levels of the testing environment.

In certain embodiments, the training battery and optionally the one or more additional training batteries is of a first battery type (e.g., a rechargeable or secondary battery), and the trained SOH estimation model is established to predict (e.g., only predict) a predicted SOH of a battery of the first battery type. Such a trained SOH estimation model may be referred to as a type-specific model. In various examples, the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

As shown in FIG. 9, starting from the left side of the illustration, multiple training batteries (i.e., cell 1, cell 2 . . . cell n) are examined, with each training battery being examined for multiple tests (i.e., RPT 1, RPT 2 . . . RPT m). In some examples, each test is performed at a different SOH to obtain a IC data from which a corresponding IC area and a corresponding IC peak are extracted. Once the IC areas and IC peaks are extracted for the multiple tests and multiple cells, they are inputted into an ICA database.

Further referring to FIG. 9, in certain embodiments, the process 270 of establishing the trained SOH estimation model by training and testing a base SOH estimation model based on at least the ICA database using Support Vector Regression includes shuffling the ICA database, forming a training group and a testing group, training a base SOH estimation model using a of the training group, and testing each iterative model (e.g., iterated from the based SOH estimation model) and modifying one or more SVR parameters until a satisfactory trained SOH estimation model is established. In certain examples, the training and testing is performed (e.g., alternatively) until an iterative SOH estimation model achieves a predetermined performance target. In some examples, the predetermined performance target includes a confidence level, accuracy level, and/or speed. In certain examples, once an iterative SOH estimation model satisfies the predetermined performance target, the iterative SOH estimation model is selected as the trained SOH estimation model.

Returning to FIG. 1, the process 120 of acquiring a QV data of a battery at a to-be-determined state of health (TBD-SOH) includes measuring the QV data including battery voltage data and corresponding battery capacity data of the battery (e.g., an on-board battery) within a predetermined voltage range during a charging cycle. For example, measuring the QV data of the battery is performed by a BMS. In certain examples, the charging cycle is a constant current charging cycle. In certain alternative embodiments, the process 210 includes acquiring the QV data of the training battery during a discharging cycle (e.g., a constant current discharging cycle).

In various embodiments, the process 130 of obtaining an IC data based on the acquired QV data includes differentiating the acquired battery capacity over the battery voltage, such as taking a first derivative of a QV curve of a QV data:

$$\frac{dQ}{dV} = \frac{\Delta Q}{\Delta V} = \frac{Q_k - Q_{k-1}}{V_k - V_{k-1}}$$

where k is selected from a range of 1 to K, where K is the total number of QV data-pairs.

In various embodiments, the process 140 of pre-processing the obtained IC data includes smoothening the IC data. In some examples, smoothening the IC data is performed using a gaussian smoothening algorithm. In certain examples, smoothening the IC data includes reducing noise, removing outliers, and/or altering the curve based on a pre-processing model (e.g., an artificial intelligence model).

In various embodiments, the process 150 of extracting an ICA area and an ICA peak from the obtained IC data includes extracting a peak value of the IC curve (e.g., the smoothened IC curve) to be the ICA peak and extracting an area value of the IC curve to be the ICA area. In some examples, the ICA peak corresponds to the highest peak of the IC curve. In certain examples, the ICA peak corresponds to a peak of the IC curve within a predetermined voltage range, such as within a first voltage value ($V_1$) and a second voltage value ($V_2$). In certain examples, the ICA area is the area under the IC curve within the predetermined voltage range, such as within $V_1$ and $V_2$. In various examples, multiple ICA peaks and multiple ICA areas are extracted from an ICA curve.

In various embodiments, the process 160 of predicting a P-SOH corresponding to the TBD-SOH based on at least analyzing the extracted ICA area and ICA peak using the trained SOH estimation model includes using a trained SOH estimation model established according to method 200. In some examples, the P-SOH is a value (e.g., P-SOH=80%). In other examples, the P-SOH is a range (e.g., a range smaller or equal to 20%, 10%, 5%, or 1%, for example, P-SOH=80%~85%). In certain examples, the process 160 of predicting the P-SOH is performed automatically, such as by a system for predicting a P-SOH.

Figure 10:
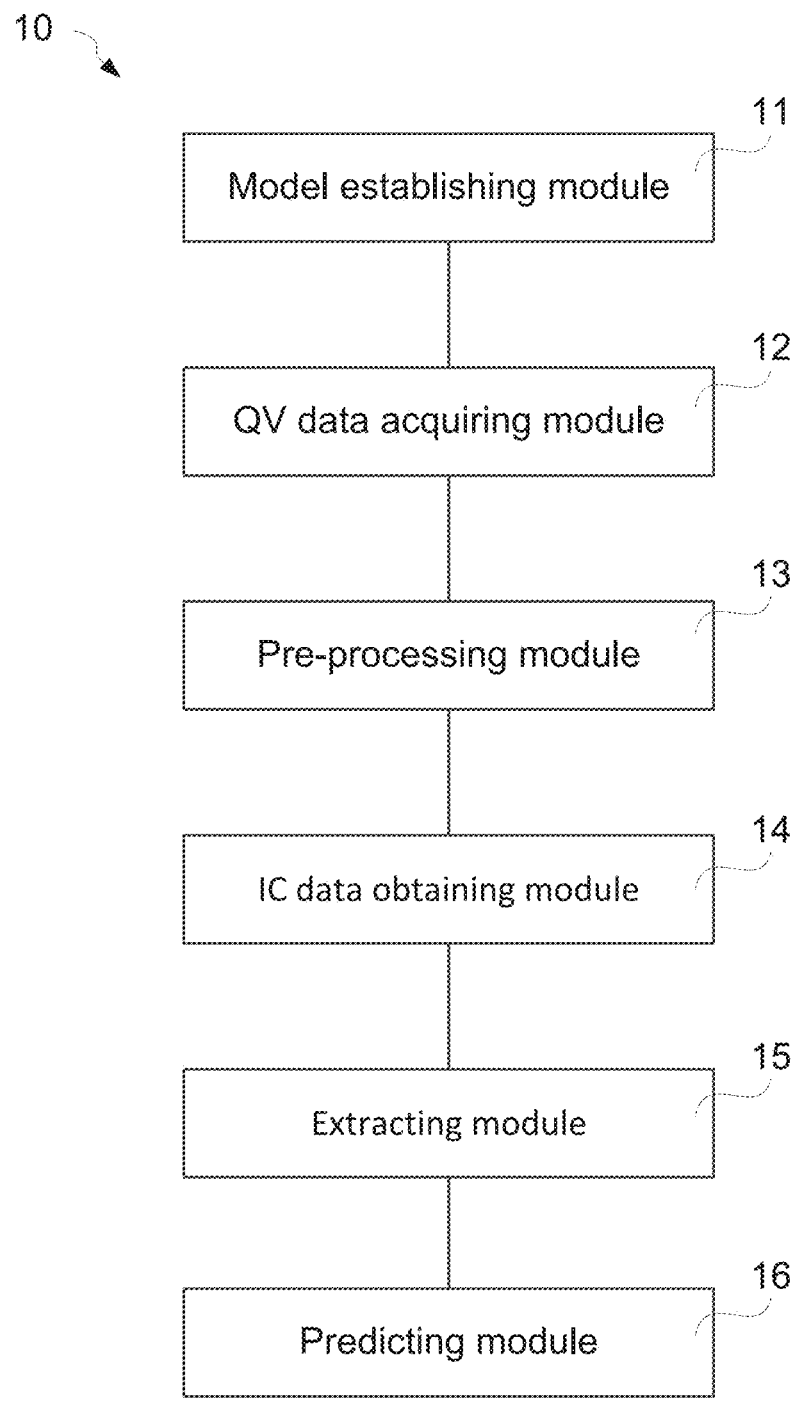
FIG. 10 is a simplified diagram showing a system for predicting a predicted state of health of a battery, according to some embodiments of the present disclosure.

FIG. 10 is a simplified diagram showing a system 10 for predicting a P-SOH, according to some embodiments of the present disclosure. This diagram is merely an example, which should not unduly limit the scope of the claims. One of ordinary skill in the art would recognize many variations, alternatives, and modifications. In some examples, the system 10 includes a model establishing module 11, a QV data acquiring module 12, a pre-processing module 13, an IC data obtaining module 14, an extracting module 15, and a predicting module 16. Although the above has been shown using a selected group of components for the system, there can be many alternatives, modifications, and variations. For example, some of the components may be expanded and/or combined. Other components may be inserted to those noted above. Depending upon the embodiment, the arrangement of components may be interchanged with others replaced.

In various embodiments, the system 10 is configured to perform the method 100, the model establishing module 11 is configured to perform the process 110 of establishing a trained SOH estimation model, the QV data acquiring module 12 is configured to perform the process 120 of acquiring a QV data of a battery at a TBD-SOH, the pre-processing module 13 is configured to perform the process 130 of obtaining an IC data based on the acquired QV data, the IC data obtaining module 14 is configured to perform the process 140 of pre-processing the obtained IC data, the extracting module 15 is configured to perform the process 150 of extracting an ICA area and an ICA peak from the obtained IC data, and/or the predicting module 16 is configured to perform the process 160 of predicting the P-SOH corresponding to the TBD-SOH based on at least analyzing the extracted ICA area and ICA peak using the trained SOH estimation model.

Figure 11:
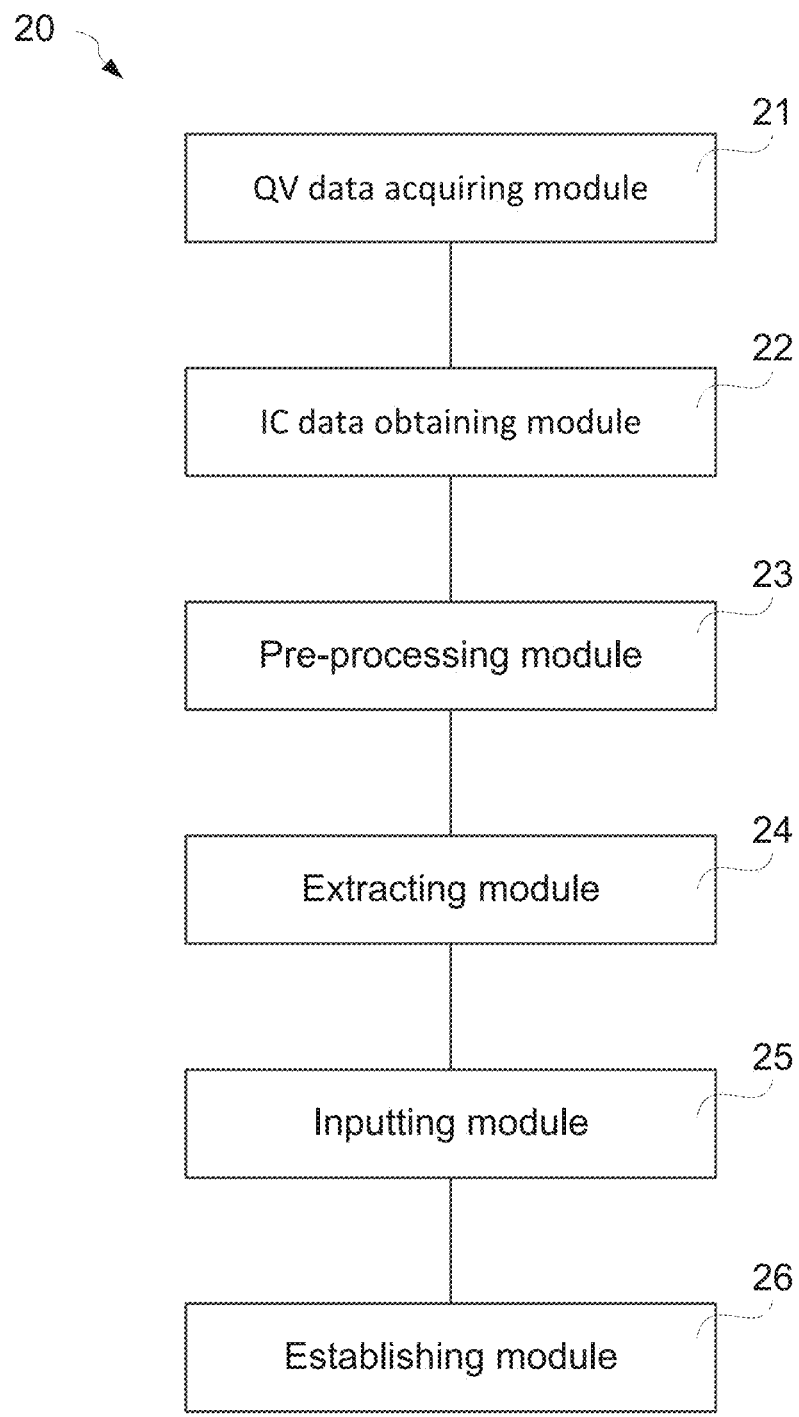
FIG. 11 is a simplified diagram showing a system for establishing a trained state of health (SOH) estimation model, according to some embodiments of the present disclosure.

FIG. 11 is a simplified diagram showing a system 20 for establishing a trained SOH estimation model, according to some embodiments of the present disclosure. This diagram is merely an example, which should not unduly limit the scope of the claims. One of ordinary skill in the art would recognize many variations, alternatives, and modifications. In some examples, the system 20 includes a QV data acquiring module 21, an IC data obtaining module 22, a pre-processing module 23, an extracting module 24, an inputting module 25, and an establishing module 26. Although the above has been shown using a selected group of components for the system, there can be many alternatives, modifications, and variations. For example, some of the components may be expanded and/or combined. Other components may be inserted to those noted above. Depending upon the embodiment, the arrangement of components may be interchanged with others replaced.

In various embodiments, the system 20 is configured to perform the method 200, the QV data acquiring module 21 is configured to perform the process 210 of acquiring a QV data of a training battery at a first SOH within a predetermined voltage range during a charging cycle, the IC data obtaining module 22 is configure to perform the process 220 of obtaining an IC data based on at least the acquired QV data, the pre-processing module 23 is configured to perform the process 230 of pre-processing the IC data, the extracting module 24 is configured to perform the process 240 of extracting an ICA area and an ICA peak from the IC data, the inputting module 25 is configured to perform the process 250 of inputting the extracted ICA area and the ICA peak into an ICA database, and/or the establishing module 26 is configured to perform the process 270 of establishing the trained SOH estimation model by training and testing a base SOH estimation model based on at least the ICA database using Support Vector Regression. In some examples, the system 20 is configured to perform the process 260 of repeating the acquiring, the obtaining, the pre-processing, the extracting, and the inputting processes on the training battery at one or more additional SOHs and optionally on one or more additional training batteries at multiple SOHs, such as by using the QV data acquiring module 21, the IC data obtaining module 22, the pre-processing module 23, the extracting module 24, and the inputting module 25.

In some examples, acquiring a QV data of a battery includes connecting and/or enabling a pre-established connection with a battery test equipment, such as a potentiostat. In various examples, acquiring a QV data of a battery includes providing current, if during a charging cycle, or extracting current, if during a discharging cycle, from an initial working voltage to a target voltage. In various embodiments, determining SOH of a battery, such as of the training battery for establishing the SOH estimation model, includes monitoring cell impedance, cell conductance, capacity loss from an pre-recorded initial state, charge-discharge energy ratio, charging and discharging voltage curves such as overpotential or plateau voltage, rate and/or magnitude of self-discharge, and/or outgassing. In some examples, smoothening IC data includes removing outliers deviating from the remaining of the data points that fall within a pre-determined acceptable denoising range.

Additional examples within the scope of the disclosure are listed below.

Example 1. A computer-implemented method for establishing a trained state of health (SOH) estimation model comprises: acquiring a voltage vs. capacity (QV) data of a training battery at a first SOH within a predetermined voltage range during a charging cycle; obtaining an incremental capacity (IC) data based on at least the acquired QV data; extracting an ICA area and an ICA peak from the IC data; inputting the extracted ICA area and the ICA peak into an ICA database; repeating the acquiring, the obtaining, the extracting, and the inputting processes on the training battery at one or more additional SOHs and optionally on one or more additional training batteries at multiple SOHs; and establishing the trained SOH estimation model by training and testing a base SOH estimation model based on at least the ICA database using Support Vector Regression. In some examples, the method is implemented according to method 200 of FIG. 2. In certain examples, the method is implemented by system 20 of FIG. 11.

Example 2. The computer-implemented method of example 1 further includes pre-processing the IC data after the process of obtaining the IC data and before the process of extracting the ICA area and the ICA peak from the IC data.

Example 3. The computer-implemented method of example 2, wherein the pre-processing the IC data includes smoothening the IC data.

Example 4. The computer-implemented method of any of examples 1 to 3, wherein the obtaining the IC data based on at least the acquired QV data includes differentiating the acquired capacity over the acquired voltage.

Example 5. The computer-implemented method of any of examples 1 to 4, wherein the extracting an ICA area and an ICA peak from the IC data includes: extracting multiple ICA secondary areas and multiple secondary ICA secondary peaks from the IC data. In some examples, each of the multiple ICA secondary areas corresponds to one of the multiple secondary ICA secondary peaks.

Example 6. The computer-implemented method of any of examples 1 to 5, wherein the training battery and optionally the one or more additional training batteries is of a first battery type. In some examples, the trained SOH estimation model is established to predict a predicted SOH of a battery of the first battery type.

Example 7. The computer-implemented method of example 6, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 8. A system for establishing a trained SOH estimation model comprises: a QV data acquiring module configured to obtain a QV data of a training battery at a first SOH within a predetermined voltage range during a charging cycle; an IC data obtaining module configured to obtain an IC data based on at least the acquired QV data; an extracting module configured to extract an ICA area and an ICA peak from the IC data; an inputting module configured to input the extracted ICA area and the ICA peak into an ICA database; and an establishing module configured to establish the trained SOH estimation model by training and testing a base SOH estimation model based on at least the ICA database using Support Vector Regression. In some examples, the system is implemented according to system 20 of FIG. 11.

Example 9. The system of example 8, further includes a pre-processing module configured to pre-process the IC data.

Example 10. The system of example 9, wherein the pre-processing module is configured to smoothen the IC data.

Example 11. The system of any of examples 8 to 10, wherein the extracting module is further configured to extract multiple ICA secondary areas and multiple secondary ICA secondary peaks from the IC data. In some examples, each of the multiple ICA secondary areas corresponds to one of the multiple secondary ICA secondary peaks.

Example 12. The system of any of examples 8 to 11, wherein the training battery and optionally the one or more additional training batteries is of a first battery type, and wherein the establishing module is configured to establish the trained SOH estimation model to predict a predicted SOH of a battery of the first battery type.

Example 13. The system of example 12, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 14. A non-transitory computer-readable medium with instructions stored thereon, that when executed by a processor, cause the processor to perform processes including: acquiring a QV data of a training battery at a first SOH within a predetermined voltage range during a charging cycle; obtaining an IC data based on at least the acquired QV data; extracting an ICA area and an ICA peak from the IC data; inputting the extracted ICA area and the ICA peak into an ICA database; repeating the acquiring, the obtaining, the extracting, and the inputting processes on the training battery at one or more additional SOHs and optionally on one or more additional training batteries at multiple SOHs; and establishing the trained SOH estimation model by training and testing a base SOH estimation model based on at least the ICA database using Support Vector Regression.

Example 15. The non-transitory computer-readable medium of example 14, when executed by the processor, further performs the process of pre-processing the IC data after the process of obtaining the IC data and before the process of extracting the ICA area and the ICA peak from the IC data.

Example 16. The non-transitory computer-readable medium of example 15, wherein the pre-processing the IC data includes smoothening the IC data.

Example 17. The non-transitory computer-readable medium of any of examples 14-16, wherein the obtaining the incremental capacity (IC) data based on at least the acquired QV data includes differentiating the acquired capacity over the acquired voltage.

Example 18. The non-transitory computer-readable medium of any of examples 14-17, when executed by the processor, further performs the process of extracting multiple ICA secondary areas and multiple secondary ICA secondary peaks from the IC data. In some examples, each of the multiple ICA secondary areas corresponds to one of the multiple secondary ICA secondary peaks.

Example 19. The non-transitory computer-readable medium of any of examples 14-18, wherein the training battery and optionally the one or more additional training batteries is of a first battery type, and wherein the non-transitory computer-readable medium when executed by the processor, performs the process of establishing the trained SOH estimation model including establishing the trained SOH estimation model to predict a predicted SOH of a battery of the first battery type.

Example 20. The non-transitory computer-readable medium of example 19, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 21. A computer-implemented method for predicting a predicted state of health (P-SOH) of a battery includes: establishing a trained state of health (SOH) estimation model; acquiring a voltage vs. capacity (QV) data of the battery at a to-be-determined state of health (TBD-SOH) within a predetermined voltage range during a charging cycle; obtaining an incremental capacity (IC) data based on at least the acquired QV data; extracting an ICA area and an ICA peak from the IC data; and predicting the predicted SOH (P-SOH) corresponding to the TBD-SOH based on at least analyzing the extracted ICA area and ICA peak using the trained SOH estimation model.

Example 22. The computer-implemented method of example 21, further includes pre-processing the IC data after the process of obtaining the IC data and before the process of extracting the ICA area and the ICA peak from the IC data.

Example 22. The computer-implemented method of example 22, wherein the pre-processing the IC data may include smoothening the IC data.

Example 23. The computer-implemented method of any of examples 20 to 22, wherein the pre-processing the IC data includes smoothening the IC data.

Example 24. The computer-implemented method of any of examples 20 to 23, wherein the obtaining the IC data based on at least the acquired QV data includes differentiating the acquired capacity over the acquired voltage.

Example 25. The computer-implemented method of any of examples 20 to 24, wherein the extracting an ICA area and an ICA peak from the IC data includes: extracting multiple ICA secondary areas and multiple secondary ICA secondary peaks from the IC data, wherein each of the multiple ICA secondary areas corresponds to one of the multiple secondary ICA secondary peaks.

Example 26. The computer-implemented method of any of examples 20 to 25, wherein the battery is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 27. A system for predicting a predicted state of health (P-SOH) of a battery, the method comprising: a model establishing module configured to establish a trained state of health (SOH) estimation model; a voltage vs. capacity (QV) data acquiring module configured to obtain a QV data of the battery at a to-be-determined state of health (TBD-SOH) within a predetermined voltage range during a charging cycle; an incremental capacity (IC) data obtaining module configured to obtain an incremental capacity (IC) data based on at least the acquired QV data; an extracting module configured to extract an ICA area and an ICA peak from the IC data; and a predicting module configured to predict the predicted SOH (P-SOH) corresponding to the TBD-SOH based on at least analyzing the extracted ICA area and ICA peak using the trained SOH estimation model.

Example 28. The system of claim 27, further includes a pre-processing module configured to pre-process the IC data.

Example 29. The system of claim 28, wherein the pre-processing module is configured to smoothen the IC data.

Example 30. The system of any of claims 27 to 29, wherein the extracting module is further configured to extract multiple ICA secondary areas and multiple secondary ICA secondary peaks from the IC data. In some examples, each of the multiple ICA secondary areas corresponds to one of the multiple secondary ICA secondary peaks.

Example 31. The system of any of claims 27 to 30, wherein the battery is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 32. A non-transitory computer-readable medium with instructions stored thereon, that when executed by a processor, cause the processor to perform processes including: establishing a trained state of health (SOH) estimation model; acquiring a voltage vs. capacity (QV) data of the battery at a to-be-determined state of health (TBD-SOH) within a predetermined voltage range during a charging cycle; obtaining an incremental capacity (IC) data based on at least the acquired QV data; extracting an ICA area and an ICA peak from the IC data; and predicting the predicted SOH (P-SOH) corresponding to the TBD-SOH based on at least analyzing the extracted ICA area and ICA peak using the trained SOH estimation model.

Example 33. The non-transitory computer-readable medium of claim 32, when executed by the processor, further performs the process of pre-processing the IC data after the process of obtaining the IC data and before the process of extracting the ICA area and the ICA peak from the IC data.

Example 34. The non-transitory computer-readable medium of claim 33, wherein the pre-processing the IC data includes smoothening the IC data.

Example 35. The non-transitory computer-readable medium of any of claims 32 to 34, wherein the obtaining the incremental capacity (IC) data based on at least the acquired QV data includes differentiating the acquired capacity over the acquired voltage.

Example 36. The non-transitory computer-readable medium of any of claims 32 to 35, when executed by the processor, further performs the process of extracting multiple ICA secondary areas and multiple secondary ICA secondary peaks from the IC data. In some examples, each of the multiple ICA secondary areas corresponds to one of the multiple secondary ICA secondary peaks.

Example 37. The non-transitory computer-readable medium of any of claims 32 to 36, the battery is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

It is to be understood that, some or all components of various embodiments of the present disclosure each are, individually and/or in combination with at least another component, implemented using one or more software components, one or more hardware components, and/or one or more combinations of software and hardware components.

In another example, some or all components of various embodiments of the present disclosure each are, individually and/or in combination with at least another component, implemented in one or more circuits, such as one or more analog circuits and/or one or more digital circuits. In yet another example, while the embodiments described above refer to particular features, the scope of the present disclosure also includes embodiments having different combinations of features and embodiments that do not include all of the described features. In yet another example, various embodiments and/or examples of the present disclosure can be combined.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to perform the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, EEPROM, Flash memory, flat files, databases, programming data structures, programming variables, IF-THEN (or similar type) statement constructs, application programming interface, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, DVD, etc.) that contain instructions (e.g., software) for use in execution by a processor to perform the methods' operations and implement the systems described herein. The computer components, software modules, functions, data stores and data structures described herein may be connected directly or indirectly to each other in order to allow the flow of data needed for their operations. It is also noted that a module or processor includes a unit of code that performs a software operation and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include client devices and servers. A client device and server are generally remote from each other and typically interact through a communication network. The relationship of client device and server arises by virtue of computer programs running on the respective computers and having a client device-server relationship to each other.

This specification contains many specifics for particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be removed from the combination, and a combination may, for example, be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Although specific embodiments of the present disclosure have been described, it will be understood by those of skill in the art that there are other embodiments that are equivalent to the described embodiments. Accordingly, it is to be understood that the disclosure is not to be limited by the specific illustrated embodiments.

What is claimed is:

1. A computer-implemented method for establishing a trained state of health (SOH) estimation model, the method comprising:
   acquiring a voltage vs. capacity (QV) data of a training battery at a first SOH within a predetermined voltage range during a charging cycle;
   obtaining an incremental capacity (IC) data based on at least the acquired QV data;
   extracting an incremental capacity analysis (ICA) area and an ICA peak from the IC data;
   inputting the extracted ICA area and the ICA peak into an ICA database;
   repeating the acquiring, the obtaining, the extracting, and the inputting processes on the training battery at one or more additional SOHs; and
   establishing the trained SOH estimation model by training and testing a base SOH estimation model based on at least the ICA database using Support Vector Regression;
   wherein the trained SOH estimation model is configured to be used by a battery management system to monitor the health of a battery.

2. The computer-implemented method of claim 1, further includes:
   pre-processing the IC data after the process of obtaining the IC data and before the process of extracting the ICA area and the ICA peak from the IC data.

3. The computer-implemented method of claim 2, wherein the pre-processing the IC data includes smoothening the IC data.

4. The computer-implemented method of claim 1, wherein the obtaining the incremental capacity (IC) data based on at least the acquired QV data includes differentiating the acquired capacity over the acquired voltage.

5. The computer-implemented method of claim 1, wherein the extracting an ICA area and an ICA peak from the IC data includes:
   extracting multiple ICA secondary areas and multiple secondary ICA secondary peaks from the IC data, wherein each of the multiple ICA secondary areas corresponds to one of the multiple secondary ICA secondary peaks.

6. The computer-implemented method of claim 1, wherein the training battery is of a first battery type, and wherein the trained SOH estimation model is established to predict a predicted SOH of a battery of the first battery type.

7. The computer-implemented method of claim 6, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

8. The computer-implemented method of claim 1, further including:
   repeating the acquiring, the obtaining, the extracting, and the inputting processes on the on one or more additional training batteries at multiple SOHs.

9. A system for establishing a trained state of health (SOH) estimation model, the system comprising:
   a voltage vs. capacity (QV) data acquiring module configured to obtain a QV data of a training battery at a first SOH within a predetermined voltage range during a charging cycle;
   an incremental capacity (IC) data obtaining module configured to obtain an IC data based on at least the acquired QV data;
   an extracting module configured to extract an incremental capacity analysis (ICA) area and an ICA peak from the IC data;
   an inputting module configured to input the extracted ICA area and the ICA peak into an ICA database; and
   an establishing module configured to establish the trained SOH estimation model by training and testing a base SOH estimation model based on at least the ICA database using Support Vector Regression;
   wherein the trained SOH estimation model is configured to be used by a battery management system to monitor the health of a battery.

10. The system of claim 9, further includes a pre-processing module configured to pre-process the IC data.

11. The system of claim 10, wherein the pre-processing module is configured to smoothen the IC data.

12. The system of claim 9, wherein the extracting module is further configured to:
   extract multiple ICA secondary areas and multiple secondary ICA secondary peaks from the IC data, wherein each of the multiple ICA secondary areas corresponds to one of the multiple secondary ICA secondary peaks.

13. The system of claim 9, wherein the training battery and optionally the one or more additional training batteries is of a first battery type, and wherein the establishing module is configured to establish the trained SOH estimation model to predict a predicted SOH of a battery of the first battery type.

14. The system of claim 13, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

15. A non-transitory computer-readable medium with instructions stored thereon, that when executed by a processor, cause the processor to perform processes including:
   acquiring a voltage vs. capacity (QV) data of a training battery at a first state of health (SOH) within a predetermined voltage range during a charging cycle;

obtaining an incremental capacity (IC) data based on at least the acquired QV data;

extracting an incremental capacity analysis (ICA) area and an ICA peak from the IC data;

inputting the extracted ICA area and the ICA peak into an ICA database;

repeating the acquiring, the obtaining, the extracting, and the inputting processes on the training battery at one or more additional SOHs; and establishing the trained SOH estimation model by training and testing a base SOH estimation model based on at least the ICA database using Support Vector Regression.

16. The non-transitory computer-readable medium of claim 15, when executed by the processor, further performs the process including:

pre-processing the IC data after the process of obtaining the IC data and before the process of extracting the ICA area and the ICA peak from the IC data.

17. The non-transitory computer-readable medium of claim 16, wherein the pre-processing the IC data includes smoothening the IC data.

18. The non-transitory computer-readable medium of claim 15, wherein the obtaining the incremental capacity (IC) data based on at least the acquired QV data includes differentiating the acquired capacity over the acquired voltage.

19. The non-transitory computer-readable medium of claim 15, when executed by the processor, further performs the process including:

extracting multiple ICA secondary areas and multiple secondary ICA secondary peaks from the IC data, wherein each of the multiple ICA secondary areas corresponds to one of the multiple secondary ICA secondary peaks.

20. The non-transitory computer-readable medium of claim 15, wherein the training battery is of a first battery type, and wherein when executed by the processor, performs the process of establishing the trained SOH estimation model including establishing the trained SOH estimation model to predict a predicted SOH of a battery of the first battery type.

* * * * *